(12) United States Patent
Yanagida et al.

(10) Patent No.: US 12,476,060 B2
(45) Date of Patent: Nov. 18, 2025

(54) CIRCUIT ASSEMBLY

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Taiji Yanagida, Osaka (JP); Hiroki Shimoda, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 220 days.

(21) Appl. No.: 18/564,396

(22) PCT Filed: Jun. 15, 2022

(86) PCT No.: PCT/JP2022/023925
§ 371 (c)(1),
(2) Date: Nov. 27, 2023

(87) PCT Pub. No.: WO2022/265036
PCT Pub. Date: Dec. 22, 2022

(65) Prior Publication Data
US 2024/0249900 A1 Jul. 25, 2024

(30) Foreign Application Priority Data
Jun. 18, 2021 (JP) .................................. 2021-101830

(51) Int. Cl.
*H05K 7/20* (2006.01)
*H01H 45/04* (2006.01)
*H01H 45/12* (2006.01)

(52) U.S. Cl.
CPC ............ *H01H 45/12* (2013.01); *H01H 45/04* (2013.01); *H05K 7/20454* (2013.01); *H05K 7/2049* (2013.01)

(58) Field of Classification Search
CPC .... H01H 45/12; H01H 45/04; H05K 7/20454; H05K 7/2049
(Continued)

(56) References Cited

U.S. PATENT DOCUMENTS 5,748,068 A * 5/1998 Kiyota .................. H01R 9/223
337/186
6,459,355 B1 * 10/2002 Furuhata ................ H01H 61/02
337/16
(Continued)

FOREIGN PATENT DOCUMENTS

JP 2018182148 A * 11/2018 ............... H05K 3/36
JP 2020-184564 11/2020
(Continued)

*Primary Examiner* — Anatoly Vortman
(74) *Attorney, Agent, or Firm* — Greenblum & Bernstein, P.L.C.

(57) ABSTRACT

A circuit assembly includes: a relay; a case that houses the relay; and a bus bar including a fastening part configured to be fastened to a connection part of the relay, and a heat transfer part configured to be in thermally conductive contact with an external heat dissipation target, wherein the relay includes an excitation connector part that is provided on a side surface of the relay, and that is open in a direction opposite to a direction in which the connection part is open, the fastening part of the bus bar protrudes upward from the heat transfer part disposed on a bottom wall side of the case so as to be inclined at an angle larger than 90°, and the (Continued)

excitation connector part of the relay in which the connection part connected to the fastening part of the bus bar is open obliquely upward.

9 Claims, 9 Drawing Sheets

(58) Field of Classification Search
USPC .......................................................... 361/626
See application file for complete search history.

(56) References Cited

U.S. PATENT DOCUMENTS

| | | | | |
|---|---|---|---|---|
| 7,701,313 | B2* | 4/2010 | Kim | H01H 71/02 |
| | | | | 439/282 |
| 8,093,984 | B2* | 1/2012 | Hofmann | H01H 71/1081 |
| | | | | 335/145 |
| 8,614,618 | B2* | 12/2013 | Darr | H01H 9/104 |
| | | | | 337/8 |
| 9,111,709 | B2* | 8/2015 | Furuhata | H01H 61/0107 |
| 9,166,420 | B2* | 10/2015 | Ikeda | H02J 7/0031 |
| 10,368,465 | B2* | 7/2019 | Aragones Carrete | |
| | | | | H01R 9/2458 |
| 10,483,063 | B1* | 11/2019 | Ahn | H01H 9/02 |
| 10,849,252 | B2* | 11/2020 | Sun | H05K 5/061 |
| 10,971,873 | B2* | 4/2021 | Rai | H01H 50/12 |
| 10,971,914 | B2* | 4/2021 | Fujimura | H05K 1/0204 |
| 11,322,325 | B2* | 5/2022 | Won | B60R 16/02 |
| 2016/0190034 | A1* | 6/2016 | Okamotoa | H01L 23/3735 |
| | | | | 257/692 |
| 2019/0297720 | A1* | 9/2019 | Fujimura | H05K 1/0204 |
| 2020/0136326 | A1* | 4/2020 | Rai | H01H 50/12 |
| 2022/0217865 | A1 | 7/2022 | Fujimura | |
| 2022/0248524 | A1 | 8/2022 | Igura et al. | |
| 2022/0394873 | A1 | 12/2022 | Kuzuhara | |
| 2022/0418085 | A1 | 12/2022 | Fujimura et al. | |

FOREIGN PATENT DOCUMENTS

| | | |
|---|---|---|
| JP | 6826331 | 1/2021 |
| JP | 2021-082682 | 5/2021 |
| JP | 2021-087265 | 6/2021 |

* cited by examiner

CIRCUIT ASSEMBLY

TECHNICAL FIELD

The present disclosure relates to a circuit assembly.

BACKGROUND ART

Conventionally, a circuit assembly including a relay that generates heat when energized may be provided with a heat dissipation structure for dissipating heat from the relay. For example, Patent Document 1 proposes a heat dissipation structure in which a bus bar connected to a connection part of a relay housed in a case is provided with a heat transfer part, and the heat transfer part disposed on the bottom surface side of the relay is in thermally conductive contact with an external heat dissipation target (e.g., a casing of a battery pack) via the case. Thus, the heat of the relay can be transferred from the connection part to the heat transfer part of the bus bar, and further can be dissipated to the heat dissipation target with which the heat transfer part is in thermal contact.

CITATION LIST

Patent Document

Patent Document 1: Japanese Patent No. 6826331

SUMMARY OF INVENTION

Technical Problem

Meanwhile, a relay is provided with an excitation connector part to which an excitation wire is connected. For example, when the excitation connector part is open laterally in the relay, a lower case and other members are disposed in proximity to each other in the periphery of the relay. Accordingly, it may not be possible to secure a sufficient working space for connecting a terminal provided at an end of the excitation wire to the excitation connector part. Therefore, it has been necessary to take measures such as connecting one end of a relay wire to the excitation connector part of the relay in advance, and routing the other end of the relay wire to a portion where a working space can be secured.

Accordingly this configuration requires additional provision of the relay wire, and therefore has an inherent problem in that the number of components and the cost of the circuit assembly are inevitably increased. To solve this problem, it is possible that the excitation connector part is disposed above the lower case by raising the position at which the relay is disposed, thereby securing the working space. However, this may cause a reduction in the heat dissipation of the relay due to an increased distance from the connection part of the relay to the heat transfer part of the bus bar, and therefore cannot be considered as a preferable measure.

Therefore, an object is to provide a circuit assembly that can reduce the number of components and the cost while suppressing a reduction in the heat dissipation of a relay.

Solution to Problem

A circuit assembly according to the present disclosure is a circuit assembly including: a relay; a case that houses the relay; and a bus bar including a fastening part configured to be fastened to a connection part of the relay, and a heat transfer part configured to be in thermally conductive contact with an external heat dissipation target, wherein the relay includes an excitation connector part that is provided on a side surface of the relay, and that is open in a direction opposite to a direction in which the connection part is open, the fastening part of the bus bar protrudes upward from the heat transfer part disposed on a bottom wall side of the case so as to be inclined at an angle larger than 90°, and the excitation connector part of the relay in which the connection part connected to the fastening part of the bus bar is open obliquely upward.

Advantageous Effects of Invention

According to the present disclosure, it is possible to provide a circuit assembly that can reduce the number of components and the cost while suppressing a reduction in the heat dissipation of a relay.

DESCRIPTION OF EMBODIMENTS

Figure 1:
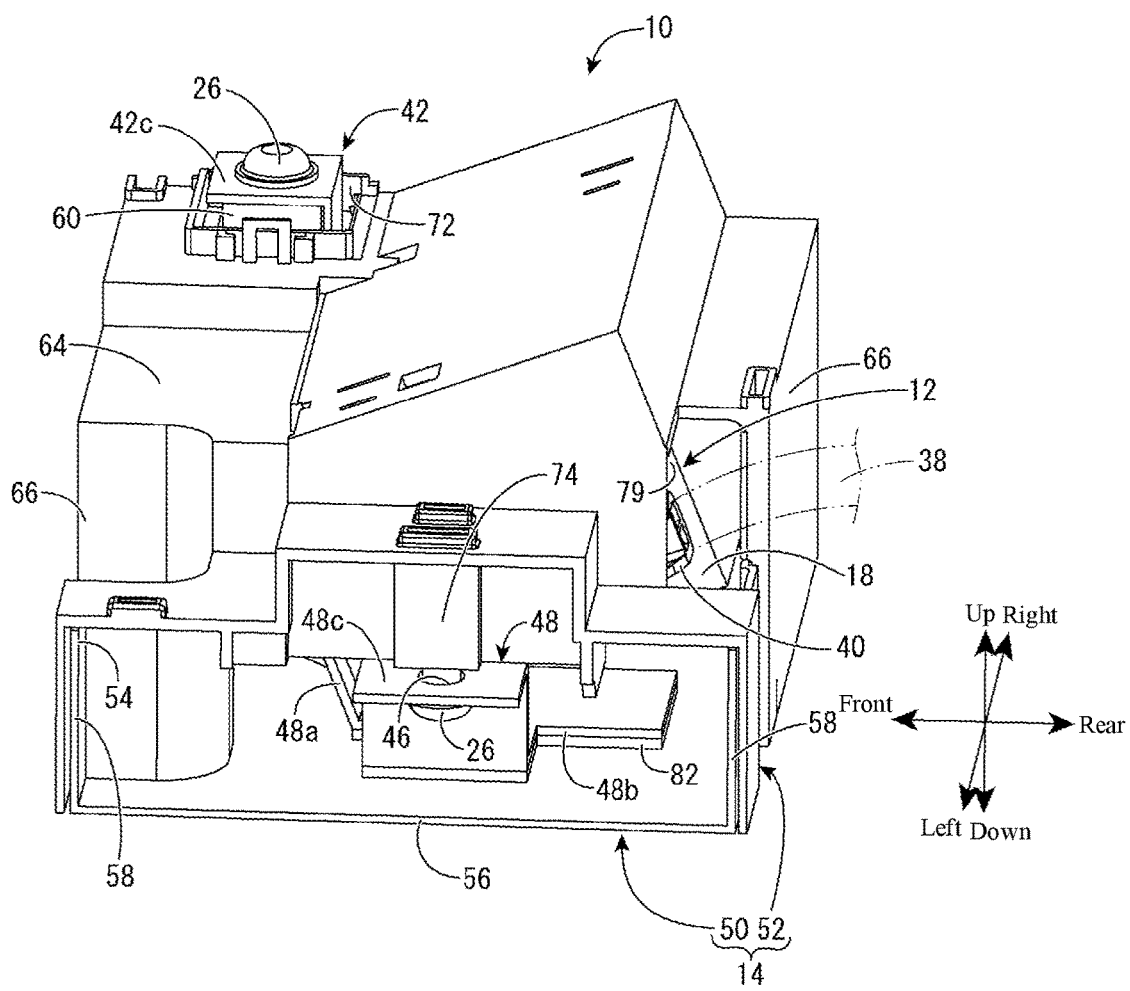
FIG. 1 is a perspective view illustrating a representative example configuration of a circuit assembly according to Embodiment 1.

Description of Embodiments of the Present Disclosure

First, aspects of the present disclosure will be listed and described.

A circuit assembly according to the present disclosure is (1) a circuit assembly including: a relay; a case that houses the relay; and a bus bar including a fastening part configured to be fastened to a connection part of the relay, and a heat transfer part configured to be in thermally conductive contact with an external heat dissipation target, wherein the relay includes an excitation connector part that is provided on a side surface of the relay and that is open in a direction opposite to a direction in which the connection part is open, the fastening part of the bus bar protrudes upward from the heat transfer part disposed on a bottom wall side of the case so as to be inclined at an angle larger than 90°, and the excitation connector part of the relay in which the connection part connected to the fastening part of the bus bar is open obliquely upward.

With this structure, the bus bar configured to be fastened to the connection part of the relay includes the fastening part configured to be fastened to the connection part, and the heat transfer part configured to be in thermally conductive contact with the external heat dissipation target. Accordingly, it is possible to construct a heat dissipation path along which heat that has been absorbed in the fastening part from the connection part of the relay is dissipated to the external heat dissipation target via the heat transfer part. Moreover, the fastening part of the bus bar protrudes upward from the heat transfer part disposed on the bottom wall side of the case so as to be inclined at an angle larger than 90°. Consequently, in the relay in which the connection part is fastened to the fastening part of the bus bar, the excitation connector part that is open in a direction opposite to a direction in which the connection part is open can be open obliquely upward. Consequently, even if the case and the other members are in proximity to the periphery of the relay, the excitation connector part is open obliquely upward, and it is therefore possible to secure a sufficient working space for connecting a terminal provided at an end of an excitation wire to the excitation connector part. Consequently, the terminal provided at an end of the excitation wire can be directly connected to the excitation connector part of the relay, and there is no need to connect a relay wire to the excitation connector part of the relay in advance as in the case of conventional structures. Accordingly, it is possible to reduce the number of components and the cost of the circuit assembly.

In addition, it is sufficient that the protruding direction of the fastening part of the bus bar from the heat transfer part is inclined, and therefore there is also no need to increase the distance from the connection part of the relay to the heat transfer part, thus making it also possible to suppress a reduction in the heat dissipation of the relay. Note that the angle formed between the heat transfer part and the fastening part of the bus bar may be any angle that allows the excitation connector part of the relay to be open obliquely upward, and may be larger than 90° and smaller than 180°, but is preferably in the range of 100° to 135°. The reason is as follows. When the inclination angle is smaller than 100°, the accessibility to the excitation connector part cannot be sufficiently improved. When the inclination angle is larger than 135°, the amount of the upward protrusion of the relay is increased, resulting in an increase in the size of the circuit assembly.

(2) It is preferable that the case has an opening that exposes the excitation connector part to the outside. The reason is that an excitation external connector that is to be connected to the excitation connector part can be easily inserted into the case through the opening. Furthermore, heat that has been transferred to the vicinity of the excitation connector part of the relay can be dissipated to the outside from the opening.

(3) It is preferable that the case includes a lower case in which the bus bar is housed, and an upper case that covers an opening of the lower case, and the upper case includes a fixing part to which the relay is fixed. Since the relay that is fastened to the fastening part of the bus bar while being inclined relative to the heat transfer part of the bus bar can be fixed on the upper case side, it is possible to stably hold the relay. Moreover, during assembly of the circuit assembly, the relay can be attached to the upper case side in advance, and it is thus possible to increase the workability.

(4) It is preferable that the upper case has an inclined surface extending parallel to an upper surface of the relay and the fixing part protrudes from the inclined surface. Since the upper case is provided with the inclined surface extending parallel to the upper surface of the relay that is inclined, and the fixing part to which the relay is fixed protrudes from the inclined surface, it is possible to provide the fixing part of the relay in the upper case in a space saving manner while downsizing the case and the circuit assembly. Moreover, since the relay can be held by the inclined surface extending parallel to the inclination direction of the relay, the relay can be held even more stably.

(5) It is preferable that the lower case has a bottom wall and a side wall, and at least a portion of an upper end of the side wall is located above the connection part of the relay. Since at least a portion of the upper end of the side wall of the lower case is located above the connection part of the relay, it is possible to advantageously ensure the waterproofness of the circuit assembly. Even in such a case, the excitation connector part of the relay is open obliquely upward, and therefore the terminal provided at an end of the excitation wire can be directly connected to the excitation connector part.

(6) It is preferable that the heat transfer part of the bus bar is in contact with a contact part of the case via a first heat conductive member having flexibility. A gap between the heat transfer part of the bus bar and the contact part of the case can be filled with the heat conductive member having flexibility, thus making it possible to increase the heat conductivity of the heat dissipation path.

(7) It is preferable that the contact part of the case is in contact with the heat dissipation target via a second heat conductive member having flexibility. A gap between the contact part of the case and the heat dissipation target can be filled with the heat conductive member having flexibility, thus making it possible to increase the heat conductivity of the heat dissipation path.

(8) It is preferable that a gap between the heat transfer part of the bus bar and a bottom surface of the relay is filled with a third heat conductive member having flexibility. This makes it possible to bring the bottom surface of the relay and the heat transfer part into thermal contact with each other via the third heat conductive member having flexibility, and it is possible to construct an additional heat dissipation path, thus increasing the heat dissipation.

(9) It is preferable that the heat transfer part of the bus bar is held in contact with the first heat conductive member via a protrusion provided on the case. This makes it possible to advantageously prevent the heat transfer part of the bus bar from being uplifted from the first heat conductive member.

Details of Embodiments of the Present Disclosure

Specific examples of a circuit assembly according to the present disclosure will be described below with reference to the drawings. It should be noted that the present disclosure is not limited to these examples, but is defined by the claims, and is intended to include all modifications which fall within the scope of the claims and the meaning and scope of equivalents thereof.

Embodiment 1

Embodiment 1 in which the technique disclosed in the present specification is applied to a circuit assembly 10 will be described with reference to FIGS. 1 to 8. The circuit assembly 10 can be mounted in, for example, a vehicle (not shown) such as an electric automobile or a hybrid automobile, and enables supply and control of power from a power supply (not shown) such as a battery to a load (not shown)

such as a motor. The circuit assembly 10 can be disposed in any orientation. However, in the following, the up-down direction, the left-right direction, and the front-rear direction will be described based on the up-down direction, the left-right direction, and the front-rear direction shown in the drawings. For a plurality of identical members, reference numerals may be assigned to some of the members, and reference numerals may be omitted for the other members.

Figure 4:
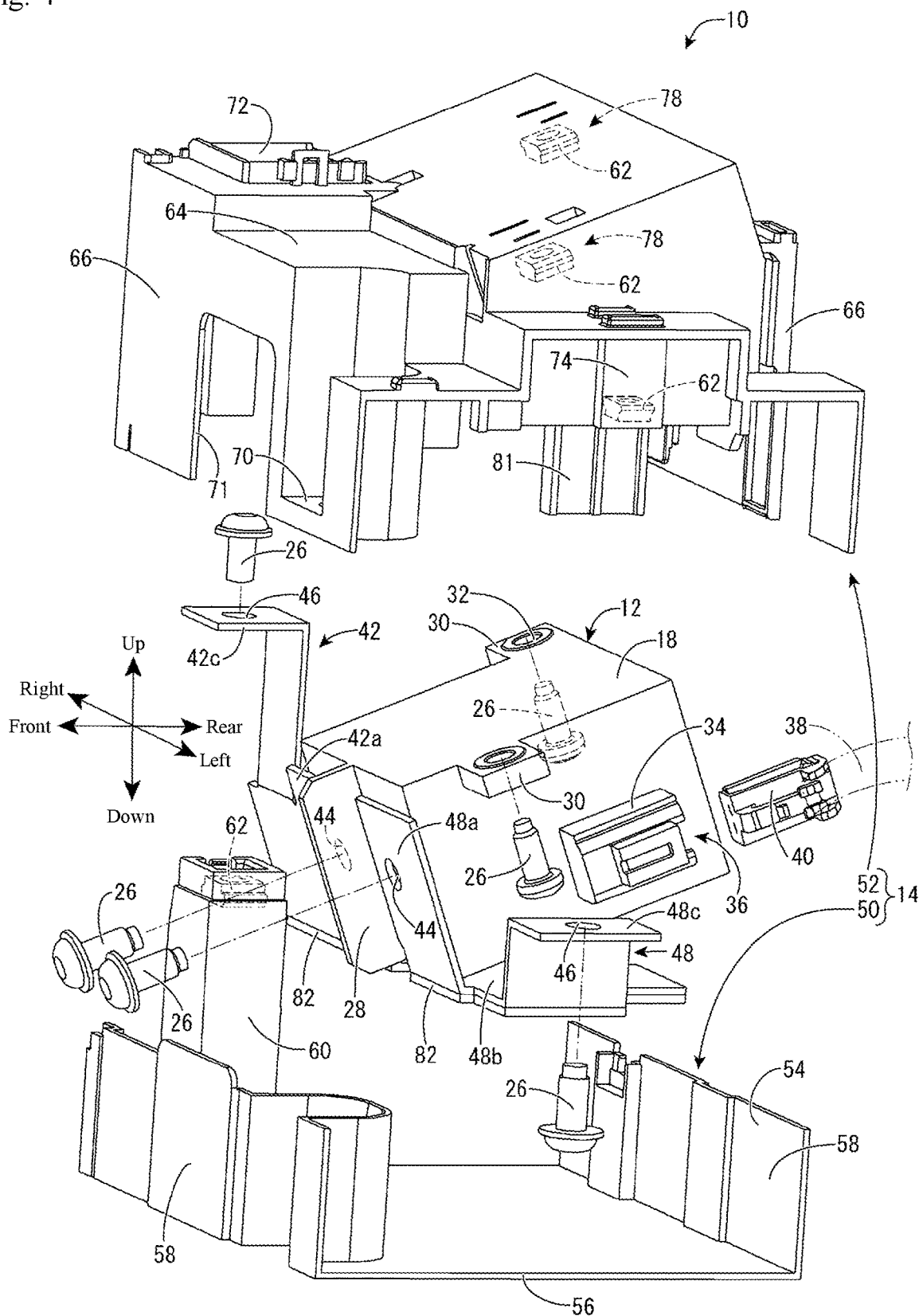
FIG. 4 is an exploded perspective view of the circuit assembly shown in FIG. 1.

As shown in FIG. 4, the circuit assembly 10 includes a relay 12, a case 14 that houses the relay 12, bus bars (a first current-carrying bus bar 42 and a second current-carrying bus bar 48 described later) configured to connect the relay 12 to an external device (not shown) such as a power supply or a motor.

Relay 12

Figure 5:
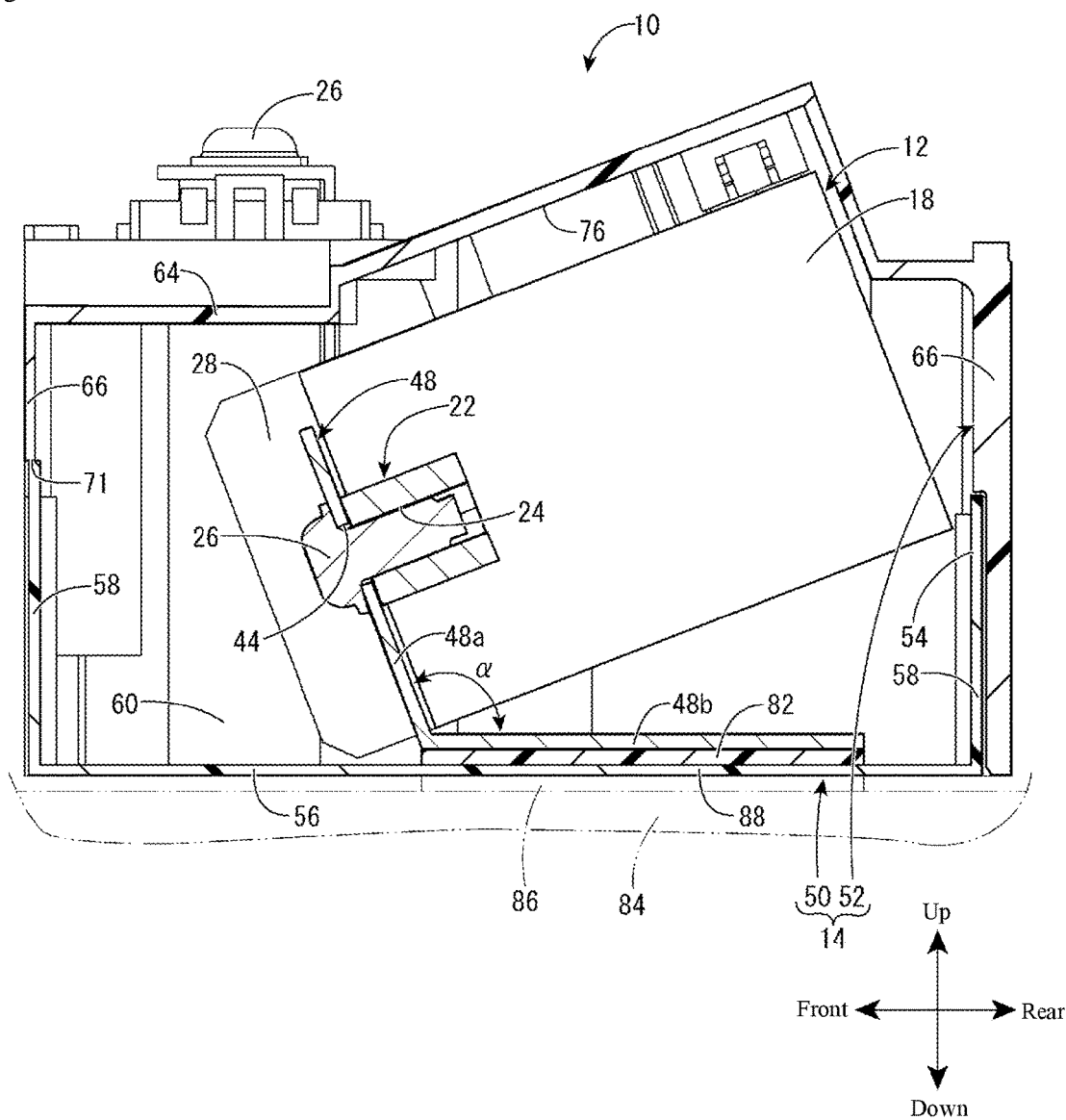
FIG. 5 is a cross-sectional view taken along the line V-V in FIG. 2.
Figure 8:
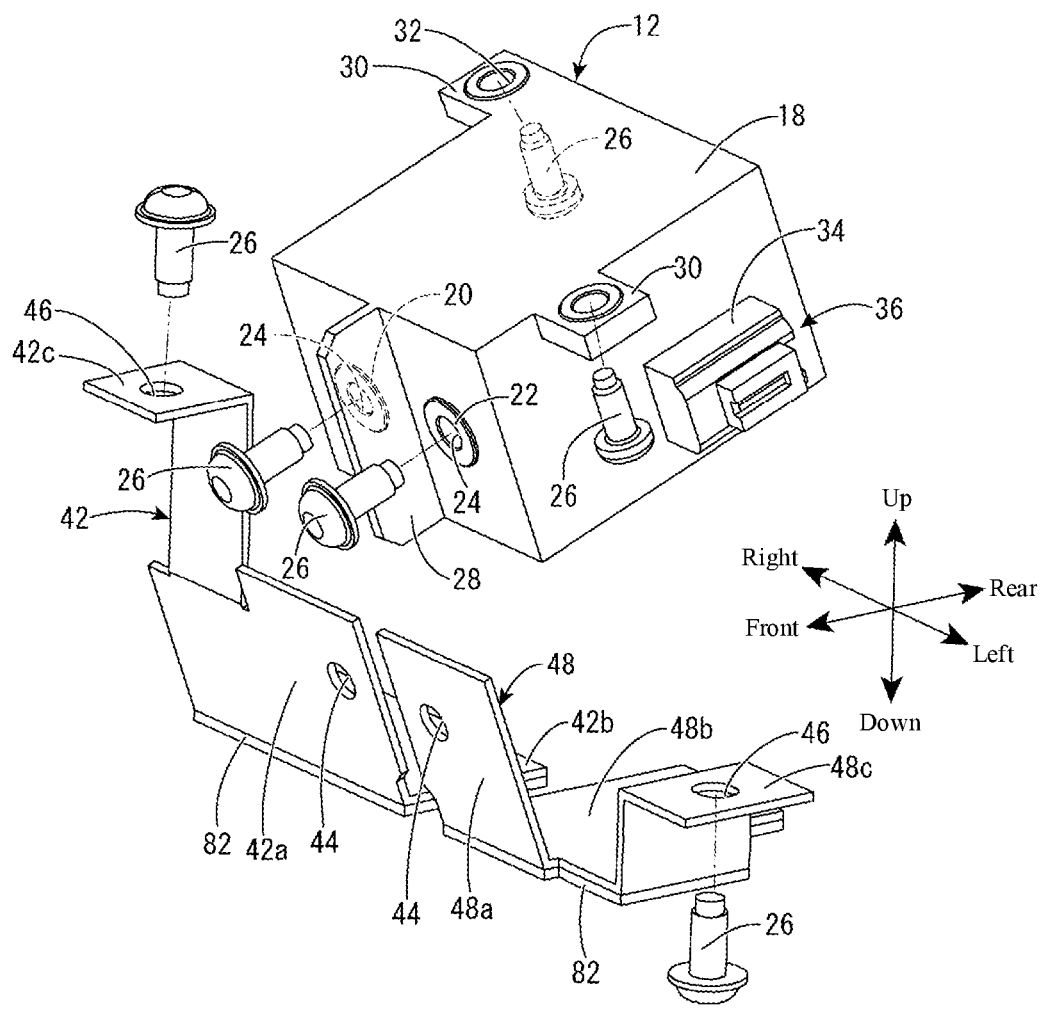
FIG. 8 is an exploded perspective view of representative components relating to a relay shown in FIG. 4.

As shown in FIGS. 5 and 8, the relay 12 is a so-called mechanical electric component that includes a contact part and a coil part (both not shown) inside a body 18 having a rectangular parallelepiped shape. On a front surface of the body 18, a first connection part 20 (an exemplary connection part) provided on the right side and a second connection part 22 (an exemplary connection part) provided on the left side are arranged in the left-right direction. When current flows between the first connection part 20 and the second connection part 22, heat is generated in the contact part and the coil part. The contact part is provided on a side in proximity to the first connection part 20 and the second connection part 22, the coil part is provided on a side spaced apart from the first connection part 20 and the second connection part 22, and the entire body 18 generates heat. A bolt hole 24 extending in the front-rear direction is formed in each of the first connection part 20 and the second connection part 22. A fastening part 42a of a first current-carrying bus bar 42, which will be described later, is connected to, and in thermally conductive contact with the first connection part 20 by screwing a bolt 26 to the bolt hole 24. A fastening part 48a of a second current-carrying bus bar 48, which will be described later, is connected to, and in thermally conductive contact with the second connection part 22 by screwing a bolt 26 to the bolt hole 24. On the front surface of the body 18, an insulating plate 28 that divides the first connection part 20 and the second connection part 22 is provided between the first connection part 20 and the second connection part 22.

As shown in FIG. 4, leg parts 30 each having a substantially rectangular plate shape as viewed from above protrude outward from two upper end portions of the body 18 of the relay 12. More specifically, one leg part 30 protrudes leftward from an upper end portion on the front side of the body 18, and another leg part 30 protrudes rightward from an upper end portion on the rear side of the body 18. A bolt insertion hole 32 through which a bolt 26 is passed is formed through each of the leg parts 30.

As shown in FIG. 4, the relay 12 further includes an excitation connector part 34 on a left side surface of the body 18 of the relay 12. The excitation connector part 34 includes an external-connector housing part 36 that is open in a direction (rearward) opposite to the direction in which the bolt hole 24 of the second connection part 22 of the first connection part 20 is open. That is, an external connector 40 provided at an end of a wire 38 connected to an external device (not shown) is inserted and fitted from the rear side into the external-connector housing part 36 of the excitation connector part 34. Thus, the excitation connector part 34 is connected to the external device, and the relay 12 can be turned on/off.

First Current-Carrying Bus Bar 42

The first current-carrying bus bar 42 is formed by pressing a metal plate material into a predetermined shape. As the metal that forms the first current-carrying bus bar 42, any metal having high thermal conductivity and low electrical resistance such as copper, a copper alloy, aluminum, and an aluminum alloy can be selected as appropriate. As shown in FIG. 8, the first current-carrying bus bar 42 includes a fastening part 42a that is configured to be bolt-fastened to the first connection part 20 formed on the front surface of the body 18 of the relay 12, and that extends obliquely downward along the front surface. The first current-carrying bus bar 42 includes a heat transfer part 42b that is bent rearward in an L-shape at an extending distal end portion of the fastening part 42a, and that extends along a bottom wall 56 of a lower case 50, which will be describe later, so as to be in thermally conductive contact with a contact part 88 of the bottom wall 56 via a first heat conductive member 82. That is, the first current-carrying bus bar 42 includes a fastening part 42a that protrudes upward from the heat transfer part 42b placed on the bottom wall 56 of the lower case 50 so as to be inclined at an angle larger than 90°. Also, the first current-carrying bus bar 42 includes an external connection part 42c protruding upward from the right side of an extending proximal end portion of the fastening part 42a, and thereafter bent forward in an L-shape. The external connection part 42c is configured to be connected to an external device (not shown) such as a battery, for example. Bolt insertion holes 44 and 46 are formed in the fastening part 42a and the external connection part 42c, respectively.

Second Current-Carrying Bus Bar 48

The second current-carrying bus bar 48 is formed by pressing a metal plate material into a predetermined shape. As the metal that forms the second current-carrying bus bar 48, any metal having high thermal conductivity and low electrical resistance such as copper, a copper alloy, aluminum, and an aluminum alloy can be selected as appropriate. As shown in FIG. 8, the second current-carrying bus bar 48 includes a fastening part 48a that is configured to be bolt-fastened to the second connection part 22 formed on the front surface of the body 18 of the relay 12, and that extends obliquely downward along the front surface. The second current-carrying bus bar 48 includes a heat transfer part 48b that is bent rearward in an L-shape at an extending distal end portion of the fastening part 48a, and that extends along the bottom wall 56 of the lower case 50, which will be described later, so as to be in contact with the contact part 88 of the bottom wall 56 via the first heat conductive member 82. That is, the second current-carrying bus bar 48 includes a fastening part 48a that protrudes upward from the heat transfer part 48b placed on the bottom wall 56 of the lower case 50 so as to be inclined at an angle larger than 90°. Also, the second current-carrying bus bar 48 includes an external connection part 48c protruding upward from a left end portion of the heat transfer part 48b, and thereafter bent leftward in an L-shape. The external connection part 48c is configured to be connected to an external device (not shown) such as a motor, for example. Bolt insertion holes 44 and 46 are formed in the fastening part 48a and the external connection part 48c, respectively.

Case 14

As shown in FIG. 4, for example, the case 14 includes a lower case 50 and an upper case 52 that are located on the lower side and the upper side, respectively, when the case 14 is installed in a vehicle, and the lower case 50 and the upper case 52 constitute the case 14. As shown in FIG. 5, for example, the case 14 is configured such that the bus bars (the first current-carrying bus bar 42 and the second current-carrying bus bar 48) are housed on the lower case 50 side, and the upper case 52 covers an upper opening 54 serving as an opening of the lower case 50.

Lower Case 50

The lower case 50 is formed by injection molding an insulating synthetic resin into a predetermined shape. The synthetic resin that forms the lower case 50 may contain a filler such as glass fiber. The lower case 50 has an overall shape of a trough that is open upward and in the left-right direction. As shown in FIG. 4, the lower case 50 includes a bottom wall 56 having a rectangular plate shape, and a pair of side walls 58 and 58 that protrude upward from front and rear end portions of the bottom wall 56. The left side of the front end portion of the bottom wall 56 is cut out in a U-shape. Consequently, at the U-shaped cut-out portion, the side wall 58 also protrudes so as to have a U-shaped cross-sectional shape. In addition, on the inner side of the side wall 58 on the front right side of the bottom wall 56, an external-connection-part fixing part 60 having a rectangular block shape protrudes upward with a protruding length that is approximately twice the protruding length of the side wall 58. A housing recess in which a nut 62 is housed is formed in a protruding distal end portion of the external-connection-part fixing part 60.

Upper Case 52

Figure 2:
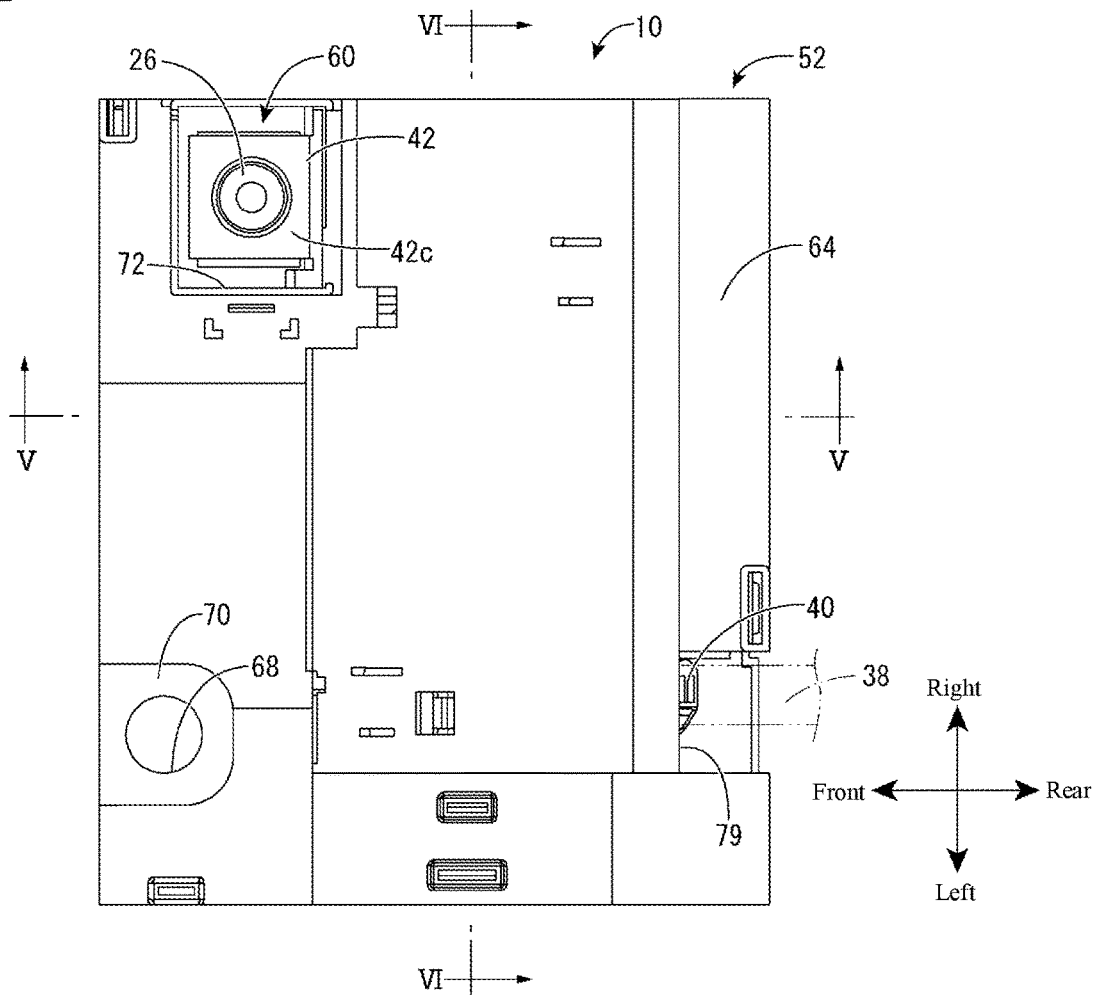
FIG. 2 is a plan view of the circuit assembly shown in FIG. 1.
Figure 7:
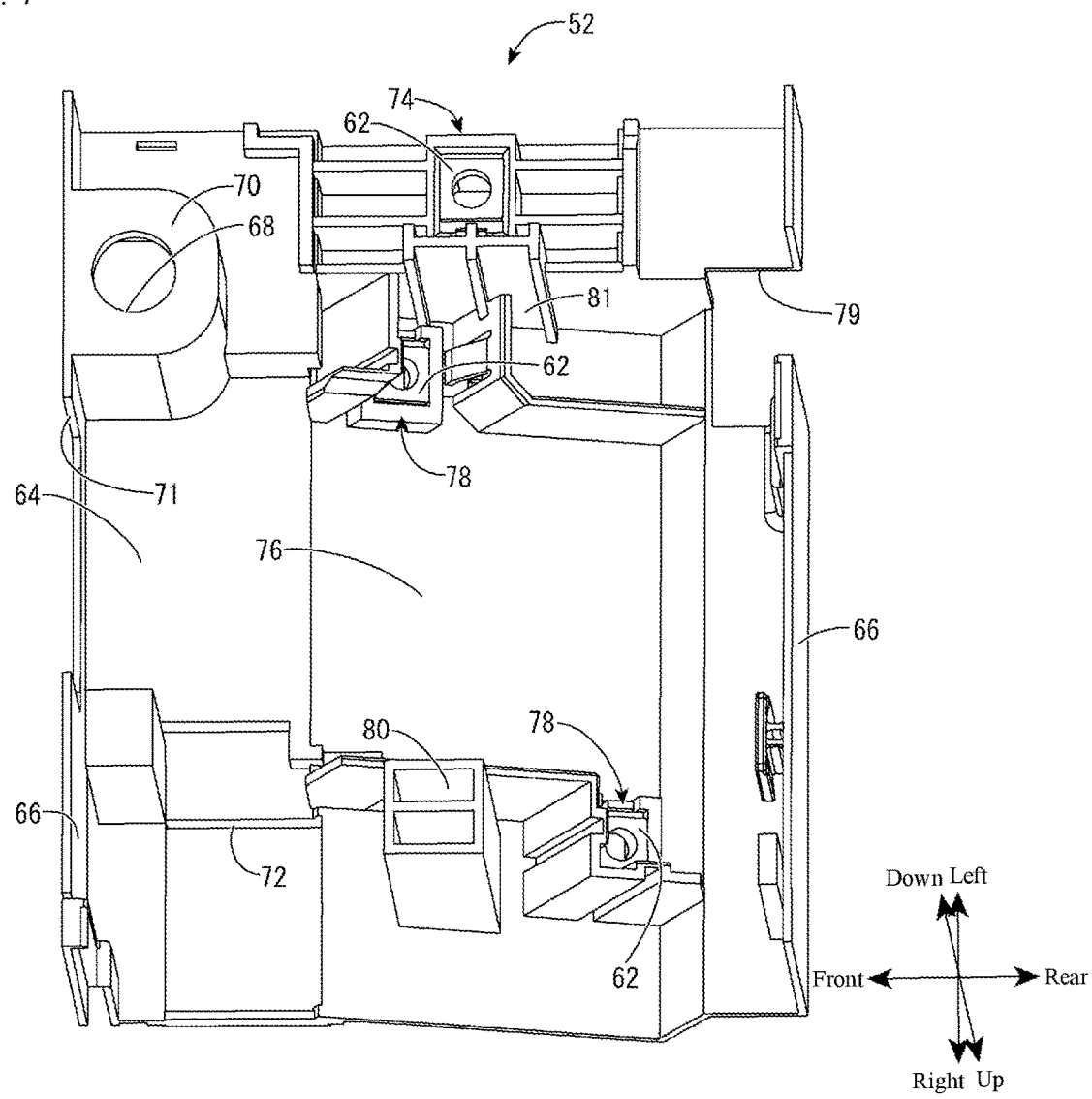
FIG. 7 is an enlarged perspective view of an upper case shown in FIG. 4 as viewed from the bottom surface side.

The upper case 52 is formed by injection molding an insulating synthetic resin into a predetermined shape. The synthetic resin that forms the upper case 52 may contain a filler such as glass fiber. As shown in FIGS. 4 and 7, the upper case 52 has an overall shape of a trough that is open downward and in the left-right direction. The upper case 52 includes an upper wall 64, and a pair of side walls 66 and 66 that protrude downward from front and rear end portions of the upper wall 64. The left side of the front end portion of the upper wall 64 is cut out in a U-shape. Consequently, at the U-shaped cut-out portion, the side wall 66 also protrudes so as to have a U-shaped cross-sectional shape. A bottom part 70 including a bolt insertion hole 68 is formed at a protruding distal end portion of the side wall 66. As shown in FIG. 4, for example, a central portion, in the left-right direction, of the side wall 66 on the front side is cut out so as to be open in the front-rear direction and downward, whereby an insertion hole 71 through which a tool can be passed is formed through the side wall 66. Furthermore, as shown in FIG. 2, for example, the front right side of the upper wall 64 is cut out into a rectangular shape in a plan view, whereby an external-connection-part insertion hole 72 is formed through the upper wall 64. In addition, as shown in FIG. 4, for example, an external-connection-part fixing part 74 having a rectangular block shape protrudes downward from the left side of a central portion of the upper wall 64. A housing recess that houses a nut 62 is formed in a protruding distal end portion of the external-connection-part fixing part 74.

Figure 3:
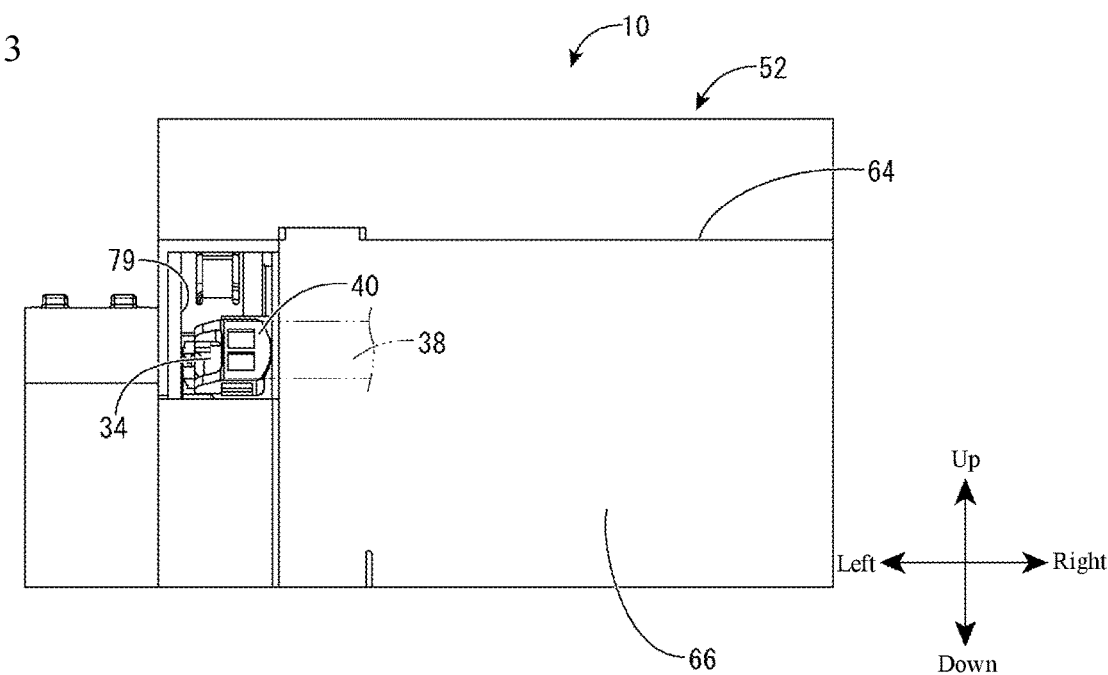
FIG. 3 is a rear view of the circuit assembly shown in FIG. 1.

As shown in FIG. 1, for example, the central portion of the upper wall 64 protrudes upward in an inverted V-shape. Consequently as shown in FIG. 5, an inclined surface 76 extending obliquely upward to the rear side is formed on the central portion of the upper wall 64. In the circuit assembly 10 in an assembled state, the inclined surface 76 extends parallel to an upper surface of the body 18 of the relay 12. As shown in FIGS. 4 and 7, fixing parts 78 that fix the corresponding leg parts 30 of the relay 12 protrude downward from a left end portion on the front side and a right end portion on the rear side, respectively, of the inclined surface 76 as will be described below. A housing recess in which a nut 62 is housed is formed in each of the fixing parts 78. As shown in FIGS. 1 to 3, for example, the left side of a rear end portion of the upper wall 64 is cut out into a rectangular shape, and the cut-out portion forms an opening 79 that exposes the excitation connector part 34 to the outside. Through the opening 79, the external connector 40 for excitation that is to be connected to the excitation connector part 34 can be easily inserted into the case 14. Furthermore, heat that has been transferred to the vicinity of the excitation connector part 34 of the relay 12 can be dissipated to the outside from the opening 79.

In addition, as shown in FIG. 7, a first protrusion 80 serving as a protrusion that protrudes downward is provided on the right end portion side of the upper wall 64. The first protrusion 80 has a shape resulting from coupling together hollow tubes in the left-right direction. Also, a second protrusion 81 serving as a protrusion that protrudes downward is provided on the left end portion side of the upper wall 64. The second protrusion 81 has a cross-sectional shape resulting from coupling together H-shaped cross sections in the front-rear direction.

Mounting Process of Circuit Assembly 10

Next, an example of a mounting process of the circuit assembly 10 will be described. The mounting process of the circuit assembly 10 is not limited to the following description.

First, an upper case 52 is prepared. Next, the upper case 52 is turned upside down, and is placed so as to be open upward. Subsequently, a relay 12 is prepared. Next, the leg parts 30 of the relay 12 are positioned relative to the corresponding fixing parts 78 of the upper case 52 in which the nuts 62 are housed, and thereafter are bolt-fastened using the corresponding bolts 26. Subsequently, a first current-carrying bus bar 42 and a second current-carrying bus bar 48 are prepared, and a first heat conductive member 82 is fixed to each of the heat transfer part 42b of the first current-carrying bus bar 42 and the heat transfer part 48b of the second current-carrying bus bar 48 using an adhesive or the like. Here, each of the first heat conductive members 82 is insulating and has the shape of a sheet that is downwardly flat. The bolt insertion holes 44 of the fastening part 42a of the first current-carrying bus bar 42 and the fastening part 48a of the second current-carrying bus bar 48 configured in this manner are positioned relative to the corresponding bolt holes 24 of the first connection part 20 and the second connection part 22 of the relay 12, and thereafter are bolt-fastened using the corresponding bolts 26. The bolt-fastening operation can be performed by inserting a tool from the insertion hole 71 of the upper case 52. Then, the bolt insertion hole 46 of the external connection part 48c of the second current-carrying bus bar 48 is positioned relative to the bolt insertion hole of the nut 62 housed in the external-connection-part fixing part 74 of the upper case 52, and thereafter is bolt-fastened using the bolt 26.

Figure 6:
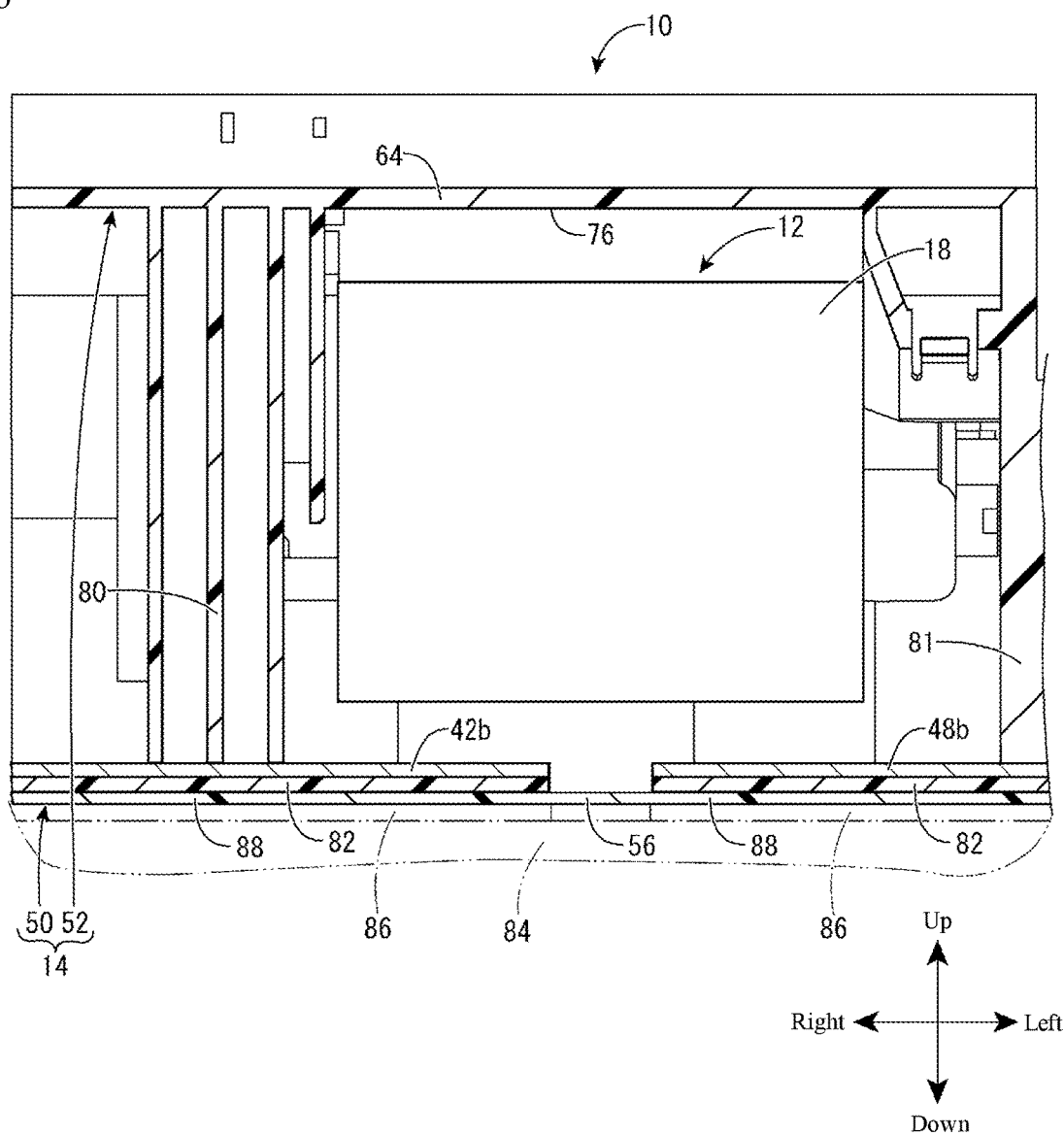
FIG. 6 is a cross-sectional view taken along the line VI-VI in FIG. 2.

Next, a lower case 50 is prepared, and is placed so as to be open upward. The upper case 52 configured in the above-described manner is mounted to the lower case 50, with the upper case 52 oriented such that the upper wall 64 is placed at the top. Consequently, the side walls 58 and 58 of the lower case 50 are fitted to the corresponding side walls 66 and 66 of the upper case 52 while being surrounded by the side walls 66 and 66. As shown in FIG. 6, the heat transfer part 42b of the first current-carrying bus bar 42 is held in contact with the first heat conductive member 82 by a protruding end face of the first protrusion 80. Accordingly, the heat transfer part 42b is pressed in a direction in which the first heat conductive member 82 is compressed, thus advantageously preventing the heat transfer part 42b from being uplifted as a result of failing to resist the reactive force of the first heat conductive member 82. Thus, the contact area between the heat transfer part 42b and the first heat conductive member 82 can be stably maintained. Furthermore, the heat transfer part 48b of the second current-carrying bus bar 48 is held in contact with the first heat conductive member 82 by a protruding end face of the second protrusion 81. Accordingly, the heat transfer part 48b is pressed in a direction in which the first heat conductive member 82 is compressed, thus advantageously preventing the heat transfer part 48b from being uplifted as a result of failing to resist the reactive force of the first heat conductive member 82. Thus, the contact area between the heat transfer part 48b and the first heat conductive member 82 can be stably maintained. The shape of the protrusion is not limited to the shapes of the first protrusion 80 and the second protrusion 81. Finally the bolt insertion hole of the nut 62 housed in the external-connection-part fixing part 60 of the lower case 50 is positioned relative to the bolt insertion hole 46 of the external connection part 42c of the first current-carrying bus bar 42 that is exposed from the external-connection-part insertion hole 72 of the upper case 52, and thereafter is bolt-fastened using a bolt 26. As a result of the foregoing, the mounting process of the circuit assembly 10 is completed. Note that the external connector 40 can be fitted at any time as needed to the external-connector housing part 36 of the excitation connector part 34 of the relay 12 through the opening 79 of the upper case 52.

As shown in FIG. 5, the circuit assembly 10 configured in this manner is configured to be in thermally conductive contact with a metal casing 84 of a battery pack serving as an external heat dissipation target via the second heat conductive member 86 by inserting a bolt into the bolt insertion hole 68 of the bottom part 70 of the upper case 52. Here, both the first heat conductive member 82 and the second heat conductive member 86 are insulating, have a sheet shape that is flat in the up-down direction, and are made of a synthetic resin having a larger thermal conductivity than air. Specifically, a silicone resin or a non-silicone resin such as an acrylic resin or a ceramic resin can be used. More specifically, it is possible to use, for example, a heat dissipation gap filler, a heat conductive grease, and a heat conductive silicone rubber that are each made of a silicone resin. The first heat conductive member 82 and the second heat conductive member 86 have flexibility, and the thickness thereof is changeable according to the force applied in the up-down direction. Therefore, gaps between the heat transfer parts 42b and 48b of the first current-carrying bus bar 42 and the second current-carrying bus bar 48 and the corresponding contact parts 88 of the lower case 50, and gaps between the contact parts 88 of the lower case 50 and the casing 84 can be filled with the first heat conductive member 82 and the second heat conductive member 86 having flexibility, thus making it possible to increase the heat conductivity of the heat dissipation path (see FIG. 5). Although the first heat conductive member 82 and the second heat conductive member 86 both have a sheet shape in the present embodiment, the present disclosure is not limited thereto, and it is possible to adopt any shape. Accordingly, the heat transfer parts 42b and 48b of the first current-carrying bus bar 42 and the second current-carrying bus bar 48 are in contact with the corresponding contact parts 88 of the lower case 50 via the first heat conductive members 82 having flexibility. Furthermore, the contact parts 88 of the lower case 50 is in contact with the casing 84 via the second heat conductive member 86 having flexibility. Consequently, the heat transfer parts 42b and 48b are in thermally conductive contact with the casing 84 serving as the external heat dissipation target.

In the circuit assembly 10 configured in this manner, the fastening parts 42a and 48a of the first current-carrying bus bar 42 and the second current-carrying bus bar 48 protrude at the same inclination angle: a relative to the heat transfer parts 42b and 48b. Therefore, in the following, the second current-carrying bus bar 48 shown in FIG. 5 will be described in detail, and the description of the first current-carrying bus bar 42 having the same structure will be omitted. As shown in FIG. 5, the fastening part 48a of the second current-carrying bus bar 48 protrudes upward from a front end portion of the heat transfer part 48b disposed on the bottom wall 56 side of the lower case 50 so as to be inclined at an inclination angle: a. In the present embodiment, the inclination angle: a is approximately 110°. Here, the inclination angle: a may be any angle that allows the excitation connector part 34 of the relay 12 to be open obliquely upward, and may be larger than 90° and smaller than 180°, but is preferably in the range of 100° to 135°. The reason is as follows. When the inclination angle is smaller than 100°, the accessibility to the excitation connector part 34 cannot be sufficiently improved. When the inclination angle is larger than 135°, the amount of upward protrusion of the relay 12 is increased, resulting in an increase in the size of the circuit assembly 10. As shown in FIG. 4, for example, the external-connector housing part 36 of the excitation connector part 34 of the relay 12 in which the second connection part 22 is connected to the fastening part 48a of the second current-carrying bus bar 48 is open obliquely upward. In addition, as shown in FIG. 5, for example, in the lower case 50, an upper end of each of the side walls 58 is located above the second connection part 22 of the relay 12. This makes it possible to advantageously ensure the waterproofness of the circuit assembly 10. Moreover, since the excitation connector part 34 of the relay 12 is open obliquely upward, the excitation connector provided at an end of the wire 38 can be directly connected to the excitation connector part 34.

Next, operations and effects of the present embodiment will be described. According to the present embodiment, as shown in FIG. 5, for example, the second current-carrying bus bar 48 that is fastened to the second connection part 22 of the relay 12 includes the heat transfer part 48b that is in contact with the contact part 88 of the bottom wall 56 of the lower case 50 via the first heat conductive member 82. Furthermore, the contact part 88 of the bottom wall 56 of the lower case 50 is in contact with the casing 84 via the second heat conductive member 86. Accordingly, it is possible to construct a heat dissipation path along which heat that has been generated in the relay 12 is transferred to the lower case 50 via the second connection part 22, the fastening part 48a and the heat transfer part 48b of the second current-carrying bus bar 48, and the first heat conductive member 82, and the heat is further dissipated to the casing 84 via the second heat conductive member 86. Moreover, the fastening part 48a protrudes upward from the heat transfer part 48b disposed on the bottom wall 56 side of the lower case 50 so as to be inclined at an angle (in the present embodiment, the inclination angle: a is approximately 110°) larger than 90°. Accordingly, in the relay 12 in which the second connection part 22 is fastened to the fastening part 48a, the excitation connector part 34 that is open rearward, which is a direction opposite to the direction in which the second connection part 22 is open, can be open obliquely upward. Therefore, even if the case 14 and the casing 84 are in proximity to the periphery of the relay 12, it is possible to secure a sufficient working space for connecting the external connector 40 provided at an end of the excitation wire 38 to the excitation connector part 34. From the foregoing, there is no need to connect a relay wire to the excitation connector part of the relay in advance as in the case of conventional structures, and it is possible to reduce the number of components and the cost of the circuit assembly 10. In order to secure the working space for connecting the external connector 40, it is sufficient that the fastening part 48*a* of the second current-carrying bus bar 48 is inclined, and therefore there is also no need to increase the distance between the heat transfer part 48*b* and the second connection part 22 of the relay 12. Accordingly, it is possible to prevent an increase in the distance from the second connection part 22 of the relay 12 to the heat transfer part 48*b*, thus making it also possible to suppress a reduction in the heat dissipation of the relay 12. Although the second current-carrying bus bar 48 has been described as an example of the bus bar, the same description also applies to the first current-carrying bus bar 42.

The upper case 52 is provided with the inclined surface 76 extending parallel to the upper surface of the body 18 of the relay 12 that is inclined, and the fixing parts 78 to which the leg parts 30 of the relay 12 are fixed protrude from the inclined surface 76. This makes it possible to suppress generation of wasted space due to formation of the inclined surface 76, and provide the fixing parts 78 of the relay 12 in the upper case 52 in a space saving manner while downsizing the case 14 and the circuit assembly 10. Moreover, since the inclined surface 76 extending parallel to the inclination direction of the upper surface of the body 18 of the relay 12 is provided, the relay 12 can be held even more stably by the inclined surface 76. Since the relay 12 that is fastened to the fastening part 48*a* of the second current-carrying bus bar 48 while being inclined relative to the heat transfer part 48*b* of the second current-carrying bus bar 48 can be fixed on the upper case 52 side, it is possible to stably hold the relay 12. Moreover, during assembly of the circuit assembly 10, the relay 12 can be attached to the upper case 52 side in advance, and it is thus possible to increase the workability.

Other Embodiments

The technique described in the present specification is not limited to the embodiments described and illustrated above. For example, the following embodiments also fall within the technical scope of the technique described in the present specification.

Figure 9:
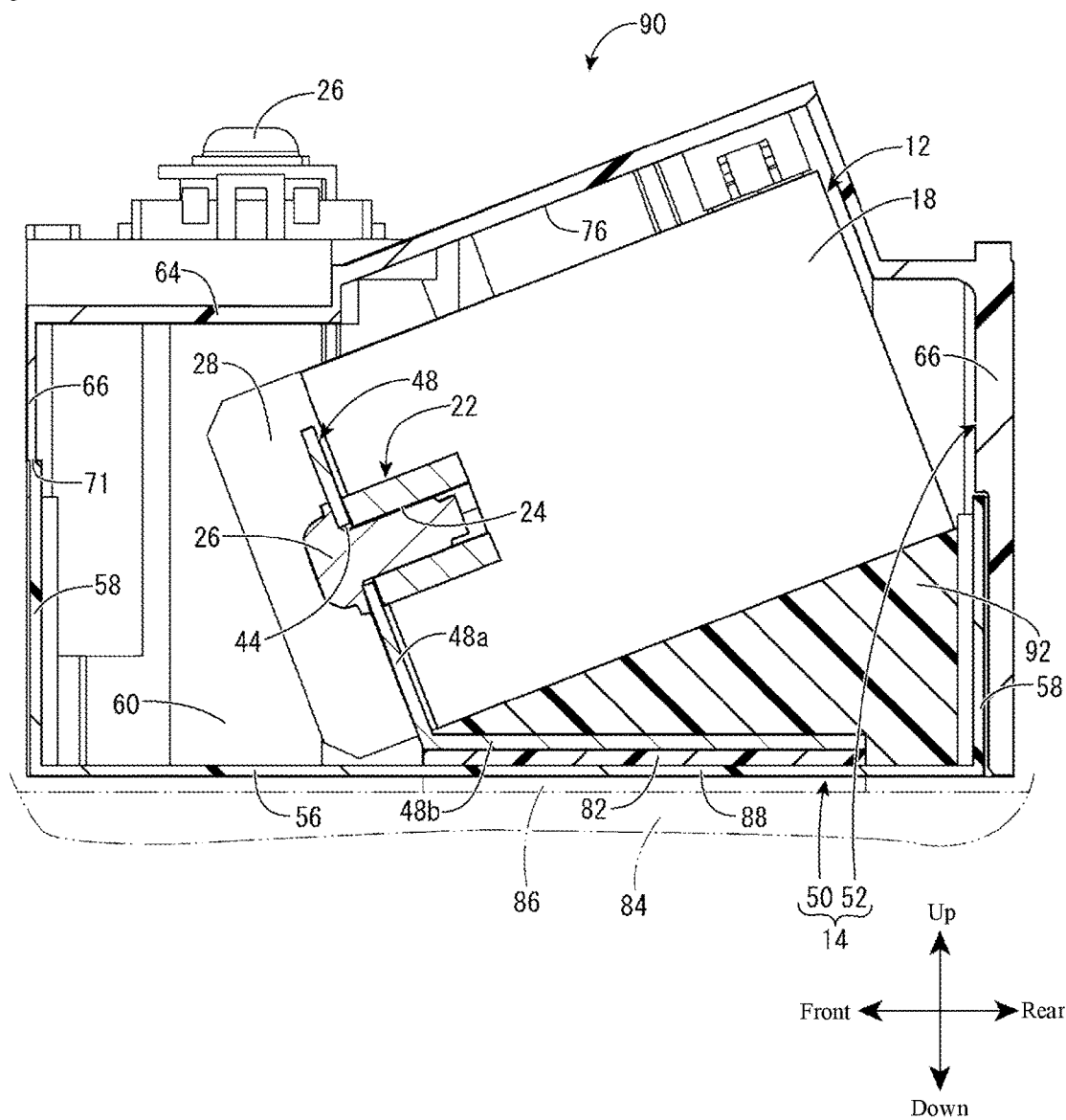
FIG. 9 is an enlarged cross-sectional view illustrating a representative example configuration of a circuit assembly according to Embodiment 2, corresponding to FIG. 5.

(1) In Embodiment 1 above, as shown in FIG. 5, for example, nothing is filled in the gap between the heat transfer part 48*b* of the second current-carrying bus bar 48 and the bottom surface of the body 18 of the relay 12. However, as in the case of a circuit assembly 90 according to Embodiment 2 shown in FIG. 9, the gap may be filled with a third heat conductive member 92 having flexibility. This allows the bottom surface of the body 18 of the relay 12 and the heat transfer part 48*b* to be in thermal contact with each other via the third heat conductive member 92 having flexibility. Accordingly, it is possible to construct an additional heat dissipation path, thus increasing the heat dissipation.

Figure 10:
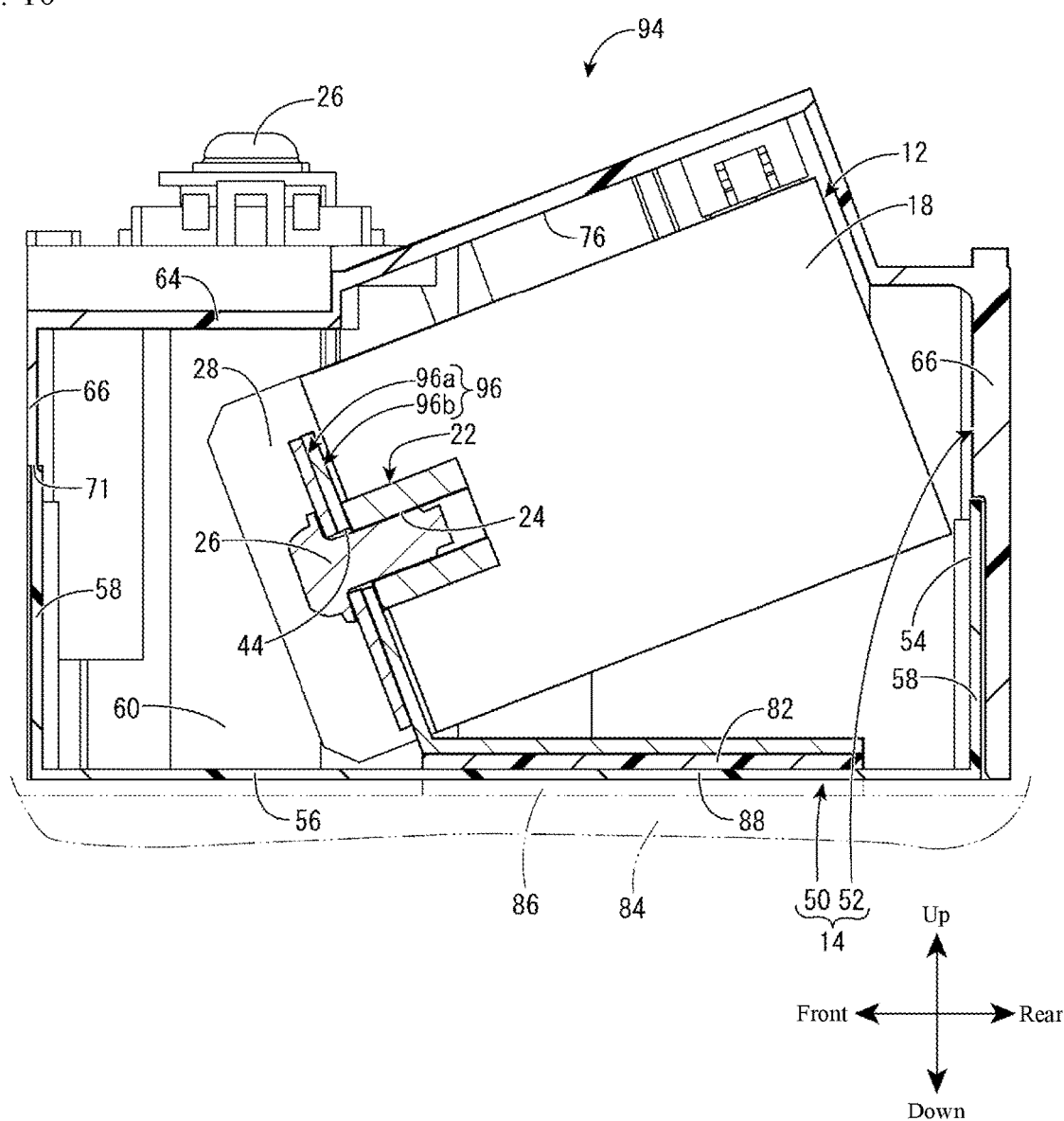
FIG. 10 is an enlarged cross-sectional view illustrating a representative example configuration of a circuit assembly according to Embodiment 3, corresponding to FIG. 5.

(2) In the above embodiments, as shown in FIG. 5, for example, the first current-carrying bus bar 42 and the second current-carrying bus bar 48 serve both to carry current and to dissipate heat. However, the present disclosure is not limited thereto. As in the case of a circuit assembly 94 according to Embodiment 3 shown in FIG. 10, a second current-carrying bus bar 96 may be divided into a bus bar 96*a* dedicated to carrying current and a bus bar 96*b* dedicated to transferring heat that are separate from each other.

(3) In the above embodiments, as shown in FIG. 5, for example, the heat transfer part 48*b* of the second current-carrying bus bar 48 is in contact with the lower case 50 via the first heat conductive member 82, and is in contact with the casing 84 via the second heat conductive member 86. However, the present disclosure is not limited thereto. The first heat conductive member 82 is not necessarily required. Similarly, the second heat conductive member 86 is also not necessarily required. That is, one of or both the two members may be omitted. Furthermore, the contact parts 88 of the lower case 50 may each be cut out into an opening, and the heat transfer part 48*b* may be in contact with the casing 84 directly or via the second heat conductive member 86. The same applies to the heat transfer part 42*b* of the first current-carrying bus bar 42.

(4) In the above embodiments, a circuit assembly (JB) mounted in a battery pack is described as an example of the circuit assembly 10. However, the present disclosure is not limited thereto, and is applicable to any circuit assembly including a relay, such as a circuit assembly mounted in an engine room.

(5) The shape of the excitation connector part 34 is not limited to the shapes illustrated in the above embodiments, and any shape may be adopted according to the shape of the counterpart component. For example, the excitation connector part may be configured to be connected to an external connector through bolt fastening.

(6) The present disclosure is not limited to a configuration in which the upper end of each of the side walls 58 of the lower case 50 is located above the second connection part 22 of the relay 12, and it is also possible to adopt a configuration in which at least a portion of the upper end of each of the side walls 58 of the lower case 50 is located above the second connection part 22 of the relay 12.

(7) The first heat conductive member 82 and the second heat conductive member 86 are each made of a synthetic resin having flexibility. However, the present disclosure is not limited thereto. The first heat conductive member 82 and the second heat conductive member 86 may be made of a curable adhesive such as a curable heat dissipation gap filler. In this case as well, the heat transfer part 42*b* of the first current-carrying bus bar 42 and the heat transfer part 48*b* of the second current-carrying bus bar 48 are held in contact with the first heat conductive member 82 and the second heat conductive member 86, respectively, by the first protrusion 80 and the second protrusion 81. Accordingly, gaps between the contact parts 88 of the lower case 50 and the heat transfer parts 42*b* and 48*b* of the first current-carrying bus bar 42 and the second current-carrying bus bar 48, and a gap between the contact parts 88 of the lower case 50 and the casing 84 can be filled with the above-described adhesive, thus making it possible to increase the heat conductivity of the heat dissipation path.

LIST OF REFERENCE NUMERALS

10 Circuit assembly (Embodiment 1)
12 Relay
14 Case
18 Body

20 First connection part (connection part)
22 Second connection part (connection part)
24 Bolt hole
26 Bolt
28 Insulating plate
Leg part
32 Bolt insertion hole
34 Excitation connector part
36 External-connector housing part
38 Wire
24 External connector
42 First current-carrying bus bar (bus bar)
42a Fastening part
42b Heat transfer part
42c External connection part
44 Bolt insertion hole
46 Bolt insertion hole
48 Second current-carrying bus bar (bus bar)
48a Fastening part
48b Heat transfer part
48c External connection part
50 Lower case
52 Upper case
54 Upper opening (opening)
56 Bottom wall
58 Side wall
60 External-connection-part fixing part
62 Nut
64 Upper wall
66 Side wall
68 Bolt insertion hole
70 Bottom part
71 Insertion hole
72 External-connection-part insertion hole
74 External-connection-part fixing part
76 Inclined surface
78 Fixing part
79 Opening
80 First protrusion (protrusion)
81 Second protrusion (protrusion)
82 First heat conductive member
84 Casing (heat dissipation target)
86 Second heat conductive member
88 Contact part
90 Circuit assembly (Embodiment 2)
92 Third heat conductive member
94 Circuit assembly (Embodiment 3)
96 Second current-carrying bus bar (bus bar)
96a Bus bar dedicated to carrying current
96b Bus bar dedicated to transferring heat

The invention claimed is:

1. A circuit assembly comprising:
a relay;
a case that houses the relay; and
a bus bar including a fastening part fastened to a connection part of the relay, and a heat transfer part configured to be in thermally conductive contact with an external heat dissipation target,
wherein the relay includes an excitation connector part that is provided on a side surface of the relay, and that is open in a direction opposite to a direction in which the connection part is open,
the fastening part of the bus bar protrudes upward from the heat transfer part disposed on a bottom wall side of the case so as to be inclined at an angle larger than 90°, and
in the relay in which the connection part is fastened to the fastening part of the bus bar, the excitation connector part is open obliquely upward.

2. The circuit assembly according to claim 1,
wherein the case has an opening that exposes the excitation connector part to the outside.

3. The circuit assembly according to claim 1,
wherein the case includes a lower case in which the bus bar is housed, and an upper case that covers an opening of the lower case, and
the upper case includes a fixing part to which the relay is fixed.

4. The circuit assembly according to claim 3,
wherein the upper case has an inclined surface extending parallel to an upper surface of the relay, and the fixing part protrudes from the inclined surface.

5. The circuit assembly according to claim 3,
wherein the lower case has a bottom wall and a side wall, and at least a portion of an upper end of the side wall is located above the connection part of the relay.

6. The circuit assembly according to claim 1,
wherein the heat transfer part of the bus bar is in contact with a contact part of the case via a first heat conductive member having flexibility.

7. The circuit assembly according to claim 6,
wherein the contact part of the case is in contact with the heat dissipation target via a second heat conductive member having flexibility.

8. The circuit assembly according to claim 7,
wherein a gap between the heat transfer part of the bus bar and a bottom surface of the relay is filled with a third heat conductive member having flexibility.

9. The circuit assembly according to claim 6,
wherein the heat transfer part of the bus bar is held in contact with the first heat conductive member via a protrusion provided on the case.

* * * * *